United States Patent
Pelham et al.

(10) Patent No.: US 8,146,037 B2
(45) Date of Patent: Mar. 27, 2012

(54) METHOD FOR GENERATING A DEEP N-WELL PATTERN FOR AN INTEGRATED CIRCUIT DESIGN

(76) Inventors: Michael Pelham, Sunnyvale, CA (US); James B. Burr, Foster City, CA (US)

( * ) Notice: Subject to any disclaimer, the term of this patent is extended or adjusted under 35 U.S.C. 154(b) by 297 days.

(21) Appl. No.: 12/544,149

(22) Filed: Aug. 19, 2009

(65) Prior Publication Data

US 2009/0313591 A1    Dec. 17, 2009

Related U.S. Application Data

(62) Division of application No. 10/772,029, filed on Feb. 3, 2004, now Pat. No. 7,645,673.

(51) Int. Cl.
*G06F 17/50* (2006.01)

(52) U.S. Cl. ........ 716/110; 716/100; 716/106; 716/111; 716/126; 716/130

(58) Field of Classification Search .............. 716/100, 716/106, 111, 126, 130, 136, 110, 139
See application file for complete search history.

(56) References Cited

U.S. PATENT DOCUMENTS

| | | |
|---|---|---|
| 4,605,980 A | 8/1986 | Hartranft et al. |
| 4,907,058 A | 3/1990 | Sakai |
| 5,160,816 A | 11/1992 | Chlop |
| 5,355,008 A | 10/1994 | Moyer et al. |
| 5,447,876 A | 9/1995 | Moyer et al. |
| 5,552,333 A | 9/1996 | Cheung et al. |
| 5,636,129 A | 6/1997 | Her |
| 5,726,477 A | 3/1998 | Williams et al. |
| 5,781,034 A | 7/1998 | Rees et al. |
| 5,895,940 A | 4/1999 | Kim |
| 5,913,122 A | 6/1999 | Lee et al. |
| 6,048,746 A | 4/2000 | Burr |
| 6,087,892 A | 7/2000 | Burr |
| 6,091,283 A | 7/2000 | Murgula et al. |
| 6,169,310 B1 | 1/2001 | Kalnitsky et al. |
| 6,180,998 B1 | 1/2001 | Crafts |
| 6,194,776 B1 | 2/2001 | Amano et al. |
| 6,218,708 B1 | 4/2001 | Burr |
| 6,218,895 B1 | 4/2001 | De et al. |
| 6,260,179 B1 | 7/2001 | Ohsawa et al. |
| 6,303,444 B1 | 10/2001 | Burr |
| 6,405,358 B1 | 6/2002 | Nuber |
| 6,412,102 B1 | 6/2002 | Andreev et al. |

(Continued)

FOREIGN PATENT DOCUMENTS

EP    624909 A2    11/1994

(Continued)

*Primary Examiner* — Sun Lin

(57) ABSTRACT

A method for the design and layout for a patterned deep N-well. A tile is specified as a fundamental building block for the deep N-well pattern. The tile comprises a first element on a first layer and may comprise a second element on a second layer. A two dimensional region is covered with an array of contiguous tiles, with the elements on each layer connecting with elements of adjacent tiles to form extended shapes. The array may be converted to a collection of sub-arrays through the removal of tiles. The array or collection of sub-arrays may be merged to produce a first layer pattern and second layer pattern. Design rule checks may be applied to verify the pattern. The first layer shapes and second layer shapes may be edited. The first layer shapes and the second layer shapes may then be combined to produce a deep N-well pattern.

20 Claims, 9 Drawing Sheets

U.S. PATENT DOCUMENTS

| | | |
|---|---|---|
| 6,489,224 B1 | 12/2002 | Burr |
| 6,498,592 B1 | 12/2002 | Matthies |
| 6,536,028 B1 | 3/2003 | Katsioulas et al. |
| 6,570,810 B2 | 5/2003 | Wong |
| 6,617,656 B2 | 9/2003 | Lee et al. |
| 6,677,643 B2 | 1/2004 | Iwamoto et al. |
| 6,724,044 B2 | 4/2004 | Blanchard |
| 6,772,859 B2 | 8/2004 | D'Antonio et al. |
| 6,777,978 B2 | 8/2004 | Hart et al. |
| 6,813,756 B2 | 11/2004 | Igarashi et al. |
| 6,892,375 B2 | 5/2005 | Kimura |
| 6,936,898 B2 | 8/2005 | Pelham et al. |
| 7,003,748 B1 | 2/2006 | Hsu |
| 7,049,699 B1 | 5/2006 | Masleid et al. |
| 7,098,512 B1 | 8/2006 | Pelham et al. |
| 7,211,478 B1 | 5/2007 | Pelham et al. |
| 7,388,260 B1 | 6/2008 | Masleid et al. |
| 7,645,673 B1 * | 1/2010 | Pelham et al. ................ 438/289 |
| 2001/0024859 A1 | 9/2001 | Takahashi et al. |
| 2001/0028577 A1 | 10/2001 | Sung et al. |
| 2002/0040985 A1 | 4/2002 | Aldrich |
| 2002/0124475 A1 | 9/2002 | Yancey |
| 2003/0121017 A1 | 6/2003 | Andreev et al. |
| 2003/0237064 A1 | 12/2003 | White et al. |
| 2004/0019870 A1 | 1/2004 | Ohmori |
| 2004/0085099 A1 | 5/2004 | Ratchkov et al. |
| 2004/0124475 A1 | 7/2004 | Pelham et al. |
| 2004/0128631 A1 | 7/2004 | Ditzel et al. |
| 2004/0128636 A1 | 7/2004 | Ishikura |
| 2004/0178493 A1 | 9/2004 | Correale, Jr. |
| 2004/0216074 A1 | 10/2004 | Hart et al. |
| 2005/0127428 A1 | 6/2005 | Mokhlesi et al. |
| 2006/0026551 A1 | 2/2006 | Shrowty et al. |
| 2006/0102958 A1 | 5/2006 | Masleid |
| 2006/0277520 A1 | 12/2006 | Gennari |
| 2006/0282798 A1 | 12/2006 | Beattie et al. |
| 2007/0038430 A1 | 2/2007 | Walker et al. |

FOREIGN PATENT DOCUMENTS

| | | |
|---|---|---|
| JP | 10199993 | 7/1998 |

* cited by examiner

METHOD FOR GENERATING A DEEP N-WELL PATTERN FOR AN INTEGRATED CIRCUIT DESIGN

This patent application is a Divisional of U.S. patent application Ser. No. 10/772,029, filed on Feb. 3, 2004 and now issued as U.S. Pat. No. 7,645,673, which is hereby incorporated by reference in its entirety.

FIELD OF THE INVENTION

Embodiments of the present invention relate to circuit design and layout in complementary metal-oxide semiconductor (CMOS) circuits. In particular, embodiments of the present invention relate to the design of body-bias voltage connections in CMOS circuits.

BACKGROUND ART

As the operating voltages for CMOS transistor circuits have decreased, variations in the threshold voltages for the transistors have become more significant. Although low operating voltages offer the potential for reduced power consumption, gate threshold voltage variations due to process and environmental variables often prevent optimum efficiency and performance from being achieved due to increased leakage currents.

Threshold voltage variations may be compensated for by body-biasing. In typical CMOS transistors, the source of the transistor has a connection to the bulk region local to the transistor. This connection may be made to the substrate or to a well in the substrate containing the transistor. Body-biasing introduces a bias potential between the bulk and the source of the transistor that allows the threshold voltage of the transistor to be adjusted electrically.

Whereas the typical CMOS transistor is a three-terminal device, the body-biased CMOS transistor is a four-terminal device, and thus requires a more complex interconnect scheme. Connections for biasing may be made on the substrate surface using conventional metal/dielectric interconnects similar to those used for typical gate, drain, and source connections, or they may be made using buried complementary well structures.

For example, in a p-type substrate with a population of surface n-wells that contain p-channel field effect transistors (PFETs), a buried n-type layer may be formed in the substrate at a depth that allows for contact with the bottom of the n-wells, while providing sufficient clearance with respect to n-channel field effect transistors (NFETs) in the substrate.

The prior art does not appreciate the disparity that exists in geometric sizes and spacing of buried substrate layers.

SUMMARY OF INVENTION

Thus, a need exists for a method for the design and layout of mask layers for patterned deep N-wells. There is also a need for a flexible and computationally efficient method that is adaptable to conventional computer aided design (CAD) tools.

Accordingly, embodiments of the present invention provide a method for generating and checking a deep N-well mask pattern that is computationally efficient and flexible. The method provides for the development of a pattern with a hierarchical structure that is subsequently edited and flattened while making efficient use of data storage and computational resources.

A method for the design and layout for a patterned deep N-well is disclosed. A tile is specified as a building block for the deep N-well pattern. The tile comprises a first element on a first layer and may also comprise a second element on a second layer. A two-dimensional region is covered with an array of contiguous tiles, with the elements on each layer connecting with elements of adjacent tiles to form extended shapes.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. The drawings referred to in this description should not be understood as being drawn to scale except if specifically noted.

DESCRIPTION OF THE PREFERRED EMBODIMENTS

In the following detailed description of the present invention, a method for generating a deep N-well pattern for an integrated circuit design, numerous specific details are set forth in order to provide a thorough understanding of the present invention. However, it will be obvious to one skilled in the art that the present invention may be practiced without these specific details. In other instances well known methods involving photolithography, ion implantation, deposition and etch, etc., and well known structures such as ohmic contacts and barrier metallization, etc., have not been described in detail so as not to unnecessarily obscure aspects of the present invention.

Figure 1:
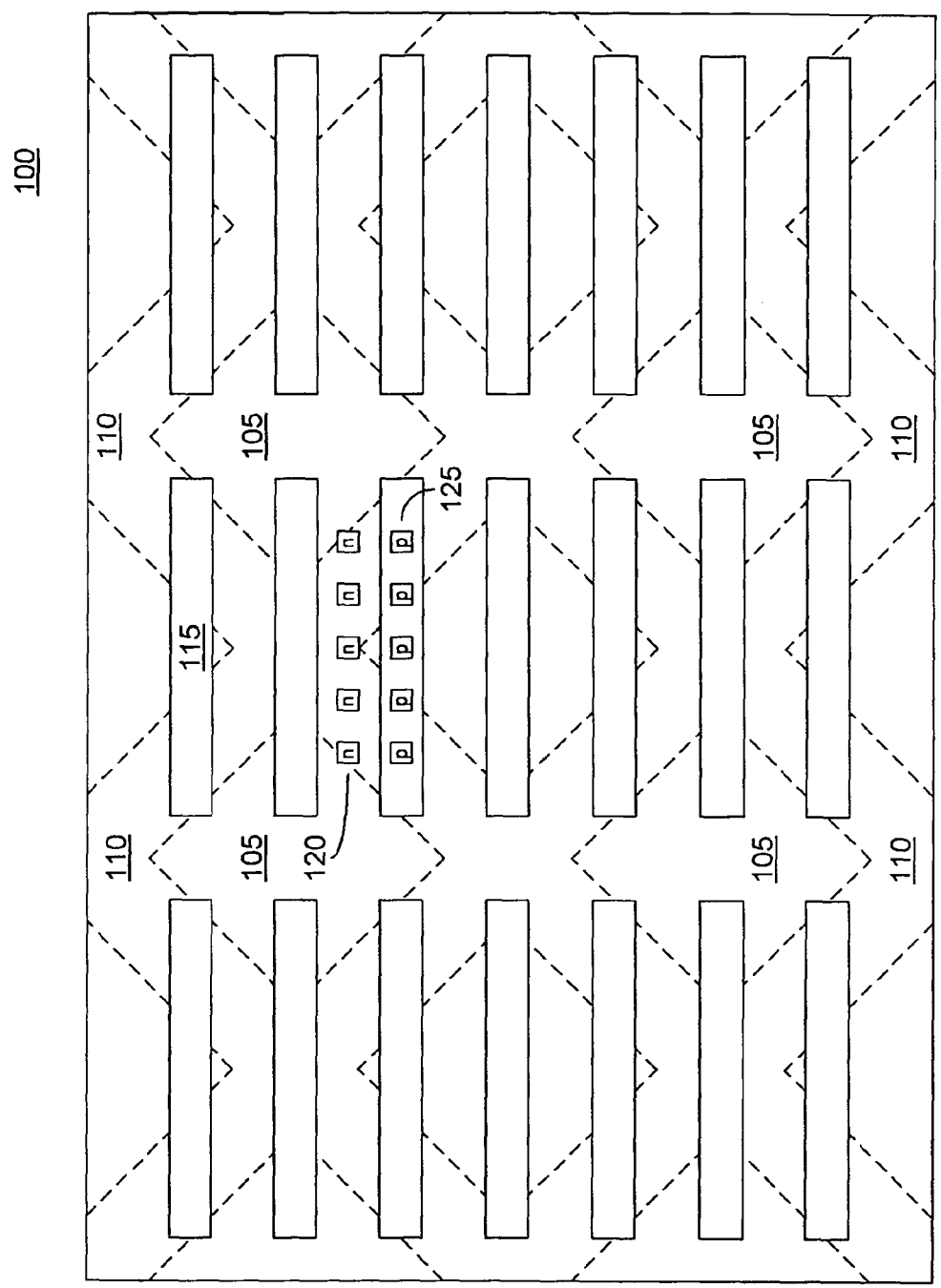
FIG. 1 shows a plan view of a deep n-well structure with surface N-wells and CMOS transistors, in accordance with an embodiment of the present claimed invention.

FIG. 1 shows a plan view of a portion 100 of a p-type integrated circuit substrate comprising a deep N-well structure 110 with a plurality of openings 105. A plurality of surface N-wells 115 are coupled to the deep N-well structure 110. A plurality of NFETs 120 resides in the p-type substrate 100, and a plurality of complementary PFETs 125 reside in an N-well 115.

The design and layout of the surface N-wells 115, PFETs 125, and NFETs 120 is conventionally done with respect to a single rectilinear coordinate system. It is to be appreciated that in a preferred embodiment, the deep N-well 110 has linear features at least some of which are aligned with a rectilinear coordinate system that is rotated with respect to the coordinate system of the surface structures.

Details of the relative alignment between the surface N-wells 115 and the deep N-well structure 110 is disclosed in a U.S. patent application titled "Diagonal Deep Well Region for Routing Body-Bias Voltage for MOSFETs in Surface Well Regions," Ser. No. 10/334,272, assigned to the assignee of the present application and filed on Dec. 31, 2002; the entire contents of which are incorporated herein by reference.

Figure 2:
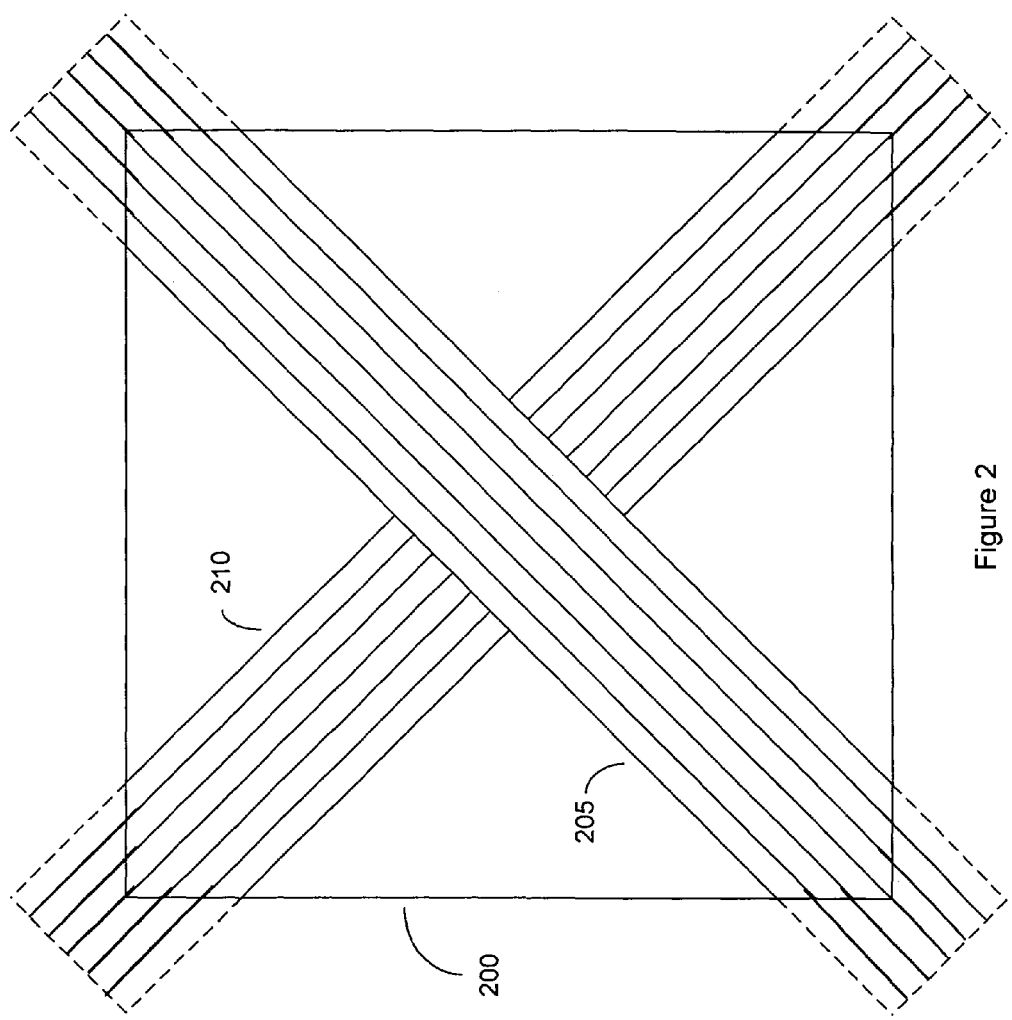
FIG. 2 shows a basic tile with two elements on two layers, in accordance with an embodiment of the present claimed invention.

FIG. 2 shows a basic tile 200 comprising a first layer element 205, and a second layer element 210, in accordance with an embodiment of the present invention. Although in other embodiments, the tile may be limited to a single layer with one or more elements, tile 200 is presented in correspondence with the deep N-well 210 of FIG. 2. Each of the elements 205 and 210 represents a portion of the deep N-well 210, and thus represents a portion of a photomask used to fabricate the deep N-well 210.

Although tile 200 is shown as square in general, rectangular tiles may be used. The minimum dimensions of the tile and the elements 205 and 210 are determined in part by the minimum attainable feature size for the deep N-well 210, and is thus determined in part by the depth at which the deep N-well is implanted. In one embodiment, the dimensions of the tile 200 and the elements 205 and 210 are selected to produce a deep N-well with the minimum attainable features. In other embodiments, the dimensions selected may be larger than the minimum attainable. For example, larger dimensions may be used to offset the impact of depletion regions on openings in the deep N-well 210.

Figure 3A:
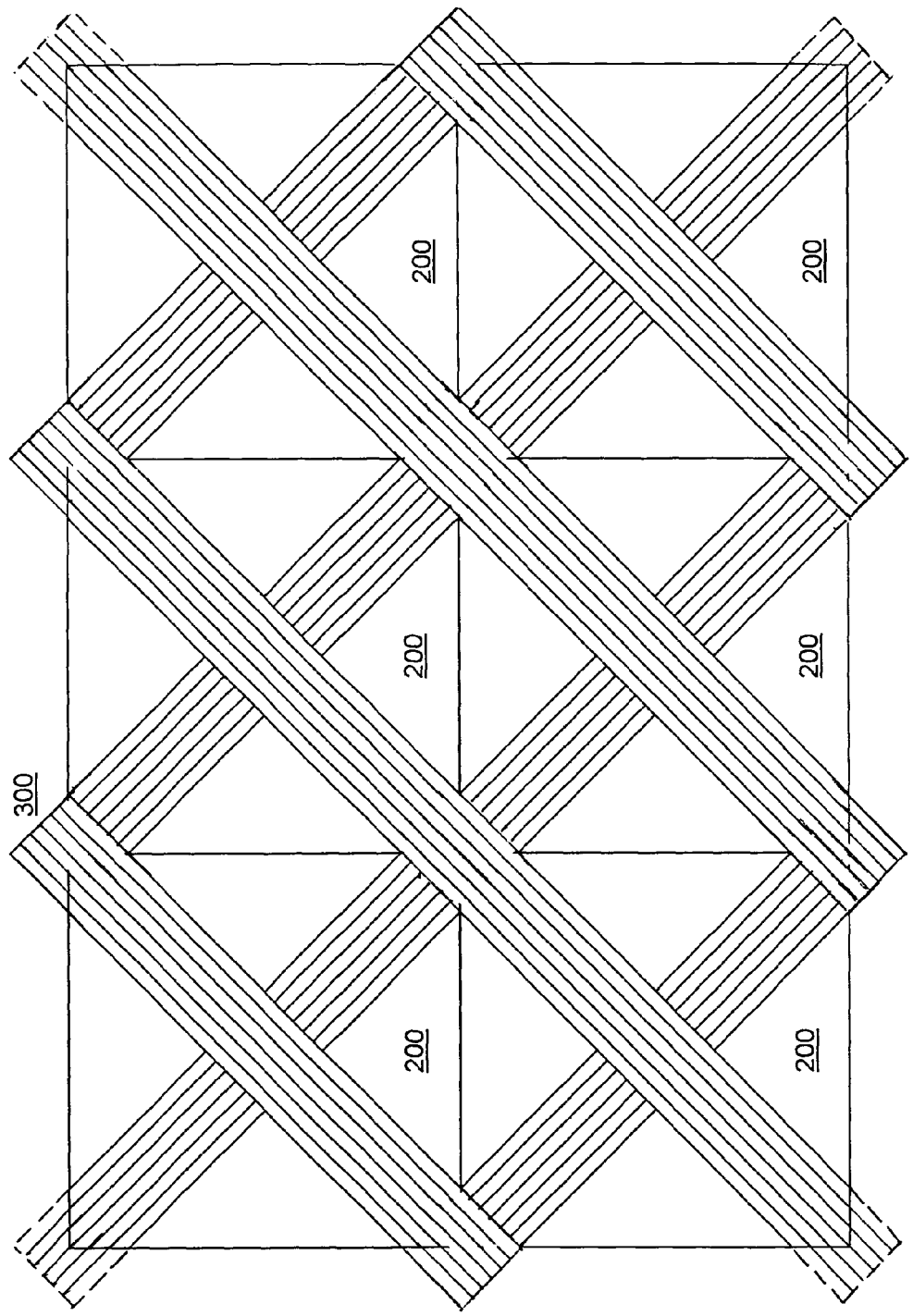
FIG. 3A shows a plan view of a tile array assembled from the tile of FIG. 2, in accordance with an embodiment of the present claimed invention.

FIG. 3A shows a tile array 300 assembled from the tile 200 of FIG. 2, in accordance with an embodiment of the present invention. The use of a single building block that is stepped and repeated at regular intervals to cover a portion of the design area provides for a compact representation in the database associated with computer aided design (CAD) tools.

As can be seen in FIG. 3A, each of elements on the contiguous tiles mate to produce an extended pattern on each of the two layers. Although a single bar is used as an element on each of the two layers, one or more shapes of varying size and complexity may be used on a tile, and also on one or more layers.

The array of tiles 300 is an efficient tool for obtaining a uniform extended pattern that conforms to a coordinate system that is rotated with respect to the coordinate system used by the surface features and the tile edges. Since the tile edges conform to the surface coordinate system, the tile may be easily introduced to (CAD) tools that are used for integrated circuit layout and design. The tile array 300 may also be conveniently edited using conventional CAD tools.

Figure 3B:
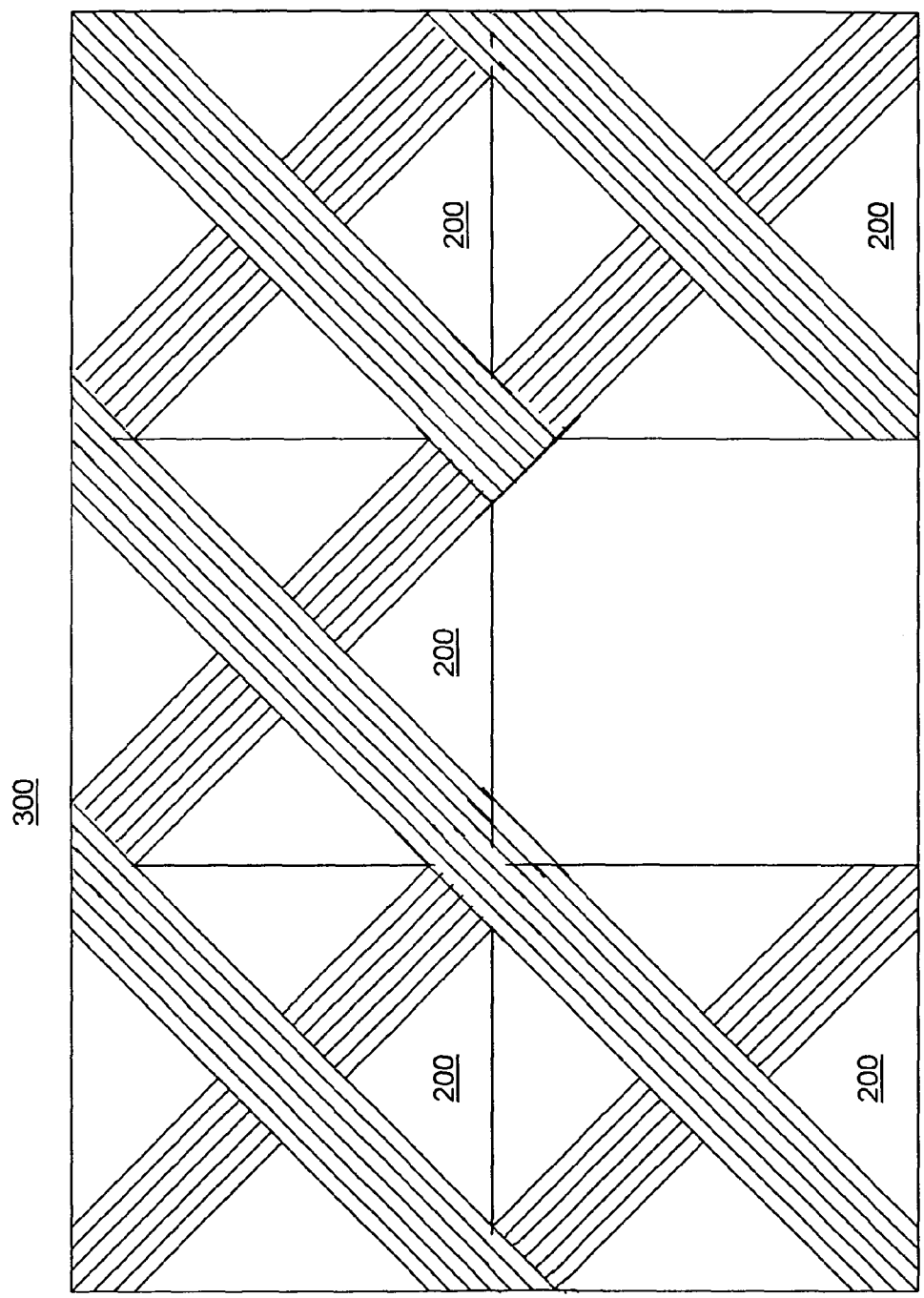
FIG. 3B shows a plan view of the tile array of FIG. 3A after editing, in accordance with an embodiment of the present claimed invention.

FIG. 3B shows the tile array 300 of FIG. 3A after editing by the removal of one tile, in accordance with an embodiment of the present invention. The removal of one tile has effectively produced three sub-arrays having either (1,1,3) or (2,1,2) tiles. Removal of one or more tiles from the initial array is one technique that may be used in editing the pattern that is ultimately used to determine the shape of a fabricated deep N-well structure.

Figure 4A:
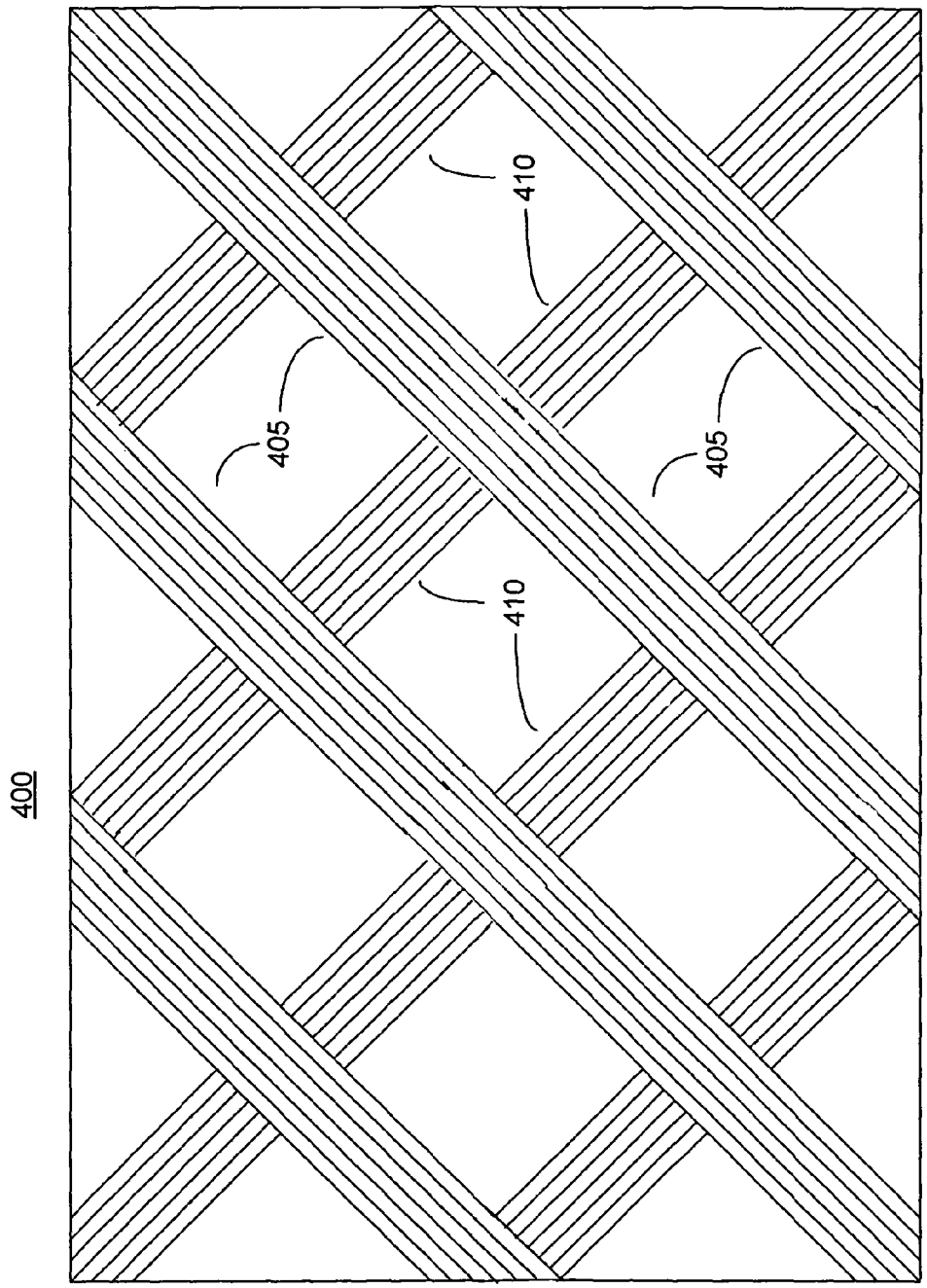
FIG. 4A shows the tile array of FIG. 3A after merging of the tiles, in accordance with an embodiment of the present claimed invention.

FIG. 4A shows the tile array 300 of FIG. 3A after merging of the tiles, in accordance with an embodiment of the present invention. Merging of the tiles results in a transformation of the tile array in the database of the CAD tool being used, and is typically done after any desired editing of the array through tile removal. The merging of the tiles produces extended shapes that reside on the two layers that were previously used by the individual tiles. Each extended shape (e.g., a stripe) is made up of a collection of segments.

With reference to FIG. 4A, the first layer now comprises a series of stripes 405 that comprise the elements 205 that were previously associated with individual tiles 200, and the second layer now comprises a series of stripes 410 that comprise the elements 210 that were previously associated with the individual tiles 200. The stripes on each layer may be further edited (e.g., trimmed or extended) by adding or removing segments. Extension of segments may be done to provide overlap to remove discontinuities that would otherwise be present at tile boundaries.

Figure 4B:
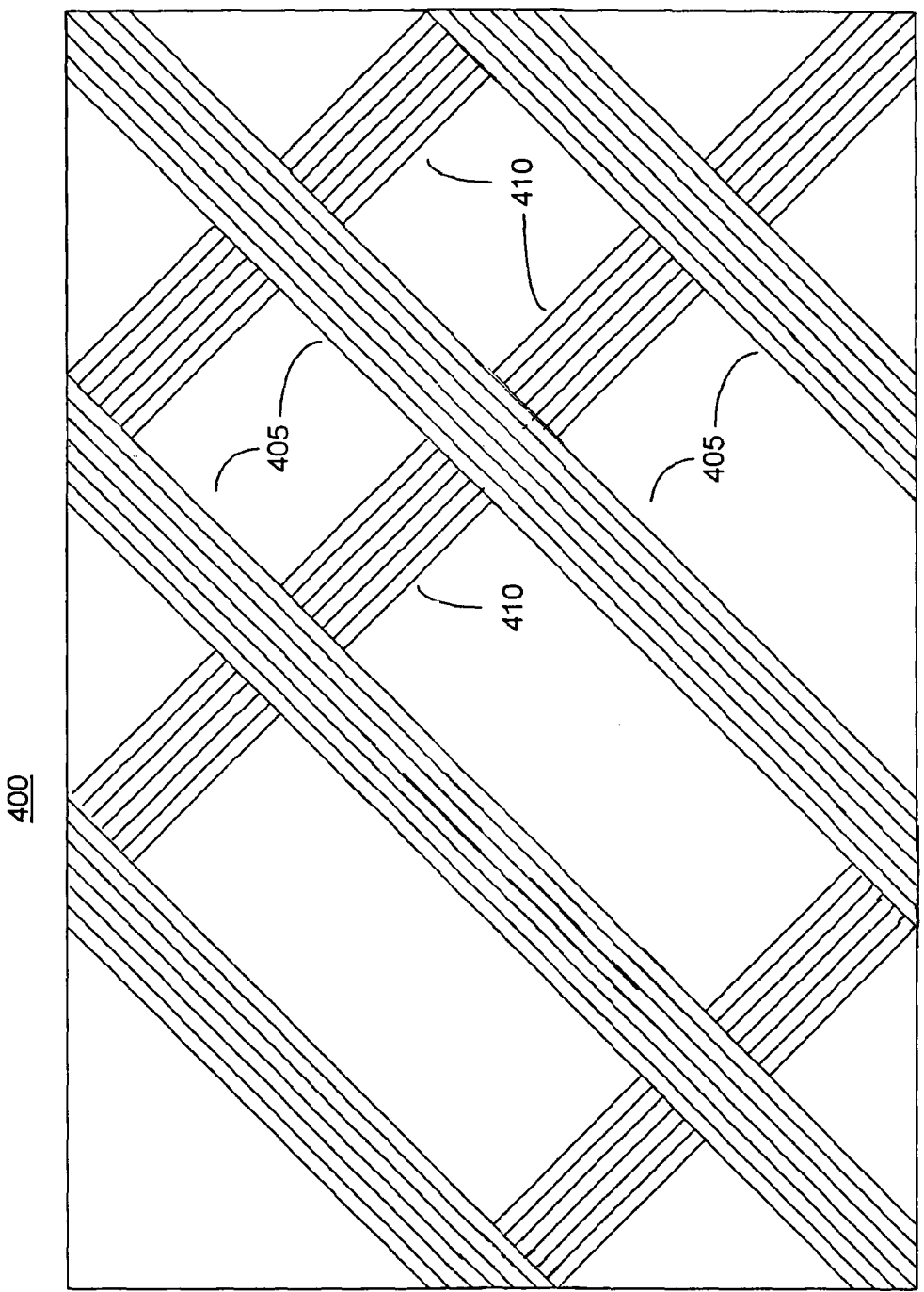
FIG. 4B shows the tile array of FIG. 4A after editing of a layer, in accordance with an embodiment of the present claimed invention.

FIG. 4B shows the tile array 400 of FIG. 4A after editing of the second layer through the removal of a stripe 410. The removal of segments from a stripe within a layer provides another editing technique that is compatible with conventional CAD tools. Regions 415 and 420 are areas in which a segment may be added to provide a continuous width for the stripes 405.

As indicated by the dashed lines at the ends of elements 205 and 210 of FIG. 2, the elements associated with a tile may extend beyond the tile boundary. Extension of elements produces an overlap that may be desired to avoid discontinuities when the elements are subsequently merged.

Figure 5:
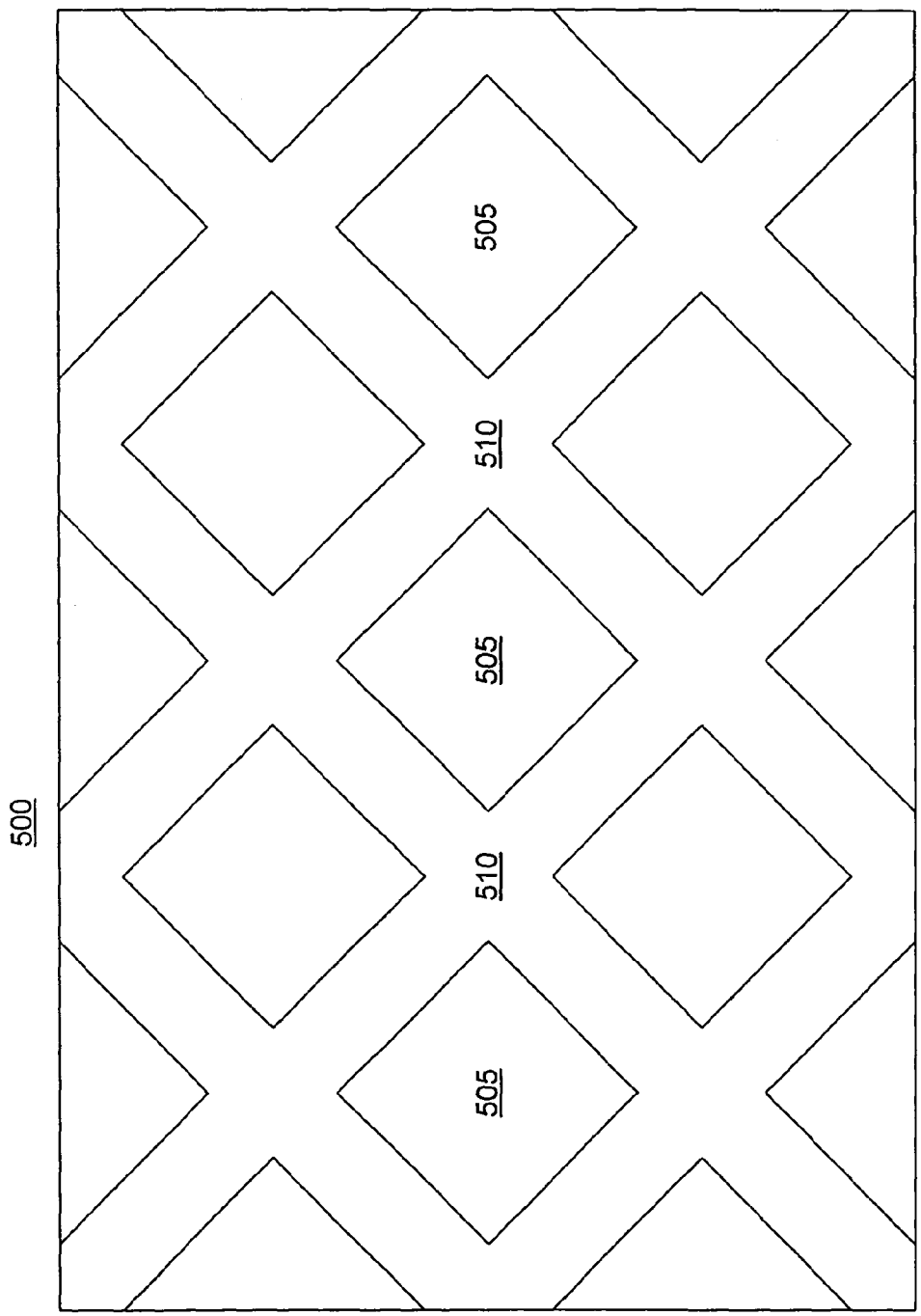
FIG. 5 shows the merged tile array of FIG. 4A after flattening, in accordance with an embodiment of the present claimed invention.

FIG. 5 shows a flattened, merged tile array 500 that results from flattening the merged tile array (two layers) 400 of FIG. 4A. Flattening is the process of combining the two layers into one, to produce a pattern 510 that exists on a single layer. The pattern 510 with openings 505 corresponds to a deep N-well structure that is produced from merging and flattening an unedited array of tiles as shown in FIG. 3A. At this point, editing and manipulation of segments is complete, and the segments cease to exist as independent entities.

Figure 6:
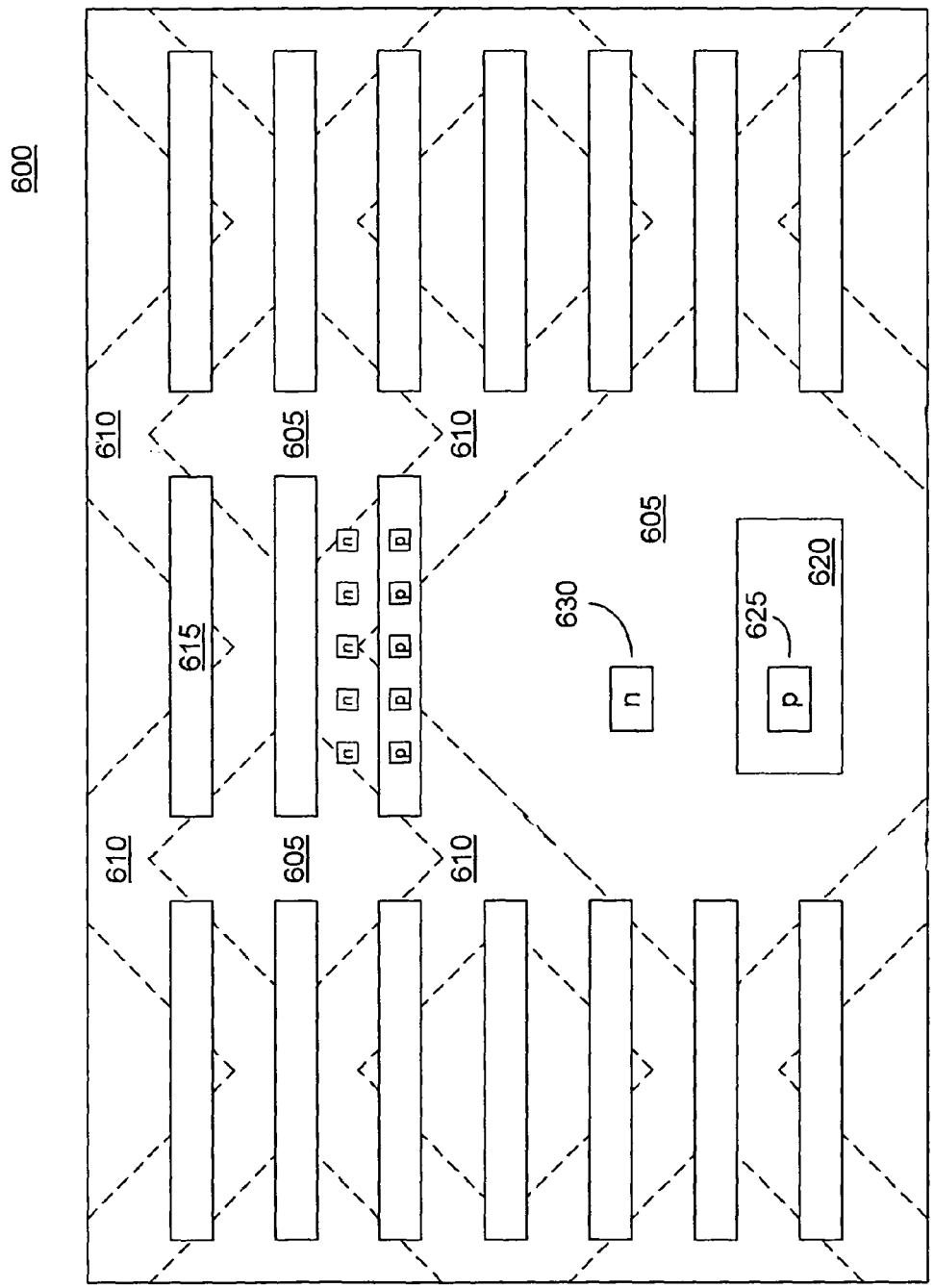
FIG. 6 shows a representative deep N-well in a CMOS circuit fabricated with a mask derived from the pattern of FIG. 3B, in accordance with an embodiment of the present claimed invention.

FIG. 6 shows a representative deep N-well 610 in a CMOS circuit substrate 600 fabricated with a mask derived from the merged and flattened pattern of FIG. 3B. In this example, a hole in the deep N-well has been produce through the removal of a tile.

During the editing of the tile arrays and layers, the removal of tiles and stripe segments may be predicated on design rules so that the editing may be performed automatically by a CAD tool. For example Cadence Assura™ may be used. Editing and checking of the extended shapes (stripes) on the layers is easier to handle than attempting to manipulate a single complex shape existing on a single layer.

There are many conditions that may drive the removal of a tile or the editing of a layer. For example, an N-well 620 may comprise a PFET 625 that does not require body-biasing. In another example, the deep N-well 610 may be trimmed to provide decoupling or isolation for an analog NFET 630.

In general, during tile array editing, tiles that are not connected to surface N-wells may be removed. Tiles may also be removed to disconnect surface N-wells from the deep N-well structure. Thus, the tiles may be removed as unwanted, or as unused, although a particular tile that has no direct connections to a surface N-well may be kept for purposes of body-bias distribution.

Design checks are made to insure that that isolation and connection of the surface N-wells is robust. A tenuous connection will negatively affect the body-bias potential, and poor isolation will lead to leakage. The robustness of deep N-well connections may be checked through perturbing the design by incrementally increasing the size of the opening in the deep N-well database structure. If the incremental increase causes an N-well to become disconnected, an edit may be made to remove the ambiguity.

Proximity checks may also be made for unconnected N-wells and NFET devices to make sure that they are sufficiently removed from the deep N-well. Also, it is desirable that the circuit path for body-biased NFETs not be unduly constricted by the deep N-well.

Figure 7:
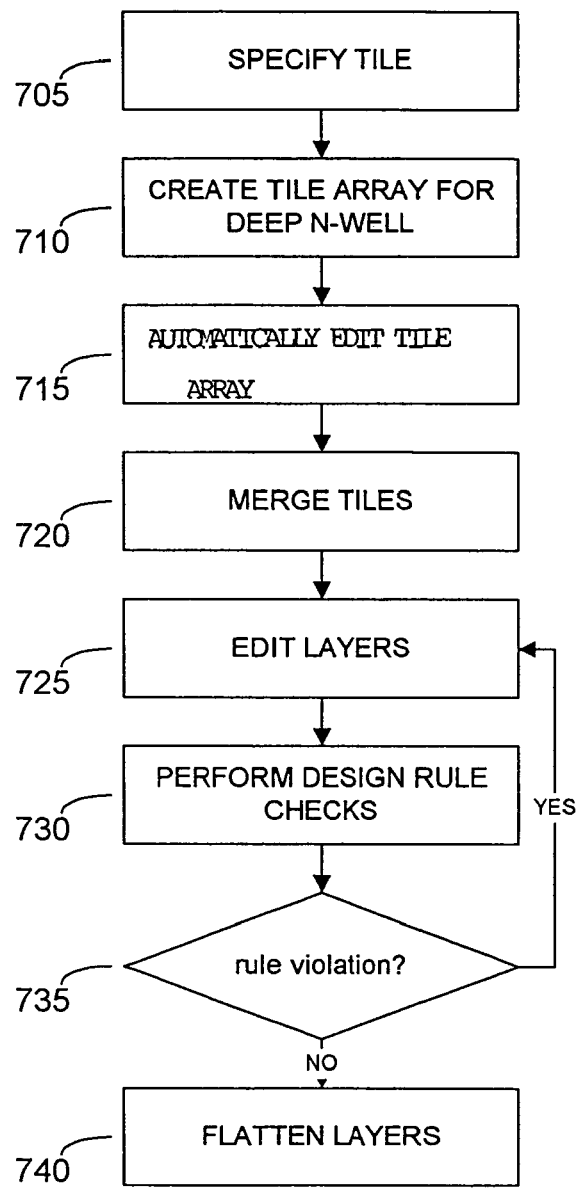
FIG. 7 shows a process flow diagram for generating a deep N-well pattern, in accordance with an embodiment of the present claimed invention.

FIG. 7 shows a process flow diagram 700 for generating a deep N-well pattern, in accordance with an embodiment of the present invention. In step 705, the individual tile geometry is specified. The tile size, number of layers, and elements on each layer are determined. This may be done on the basis of established rules, and may be done with or without user input.

In step 710, an array of tiles is created over an area of the circuit in which a deep N-well structure is desired. The use of a tile allows the initial generation of the structure to be done efficiently and automatically. In step 715, the array of tiles may be automatically edited by removing tiles on the basis of predefined requirements for voltage supply connections. The removal of tiles may result in a single larger array of tiles being converted to a collection of smaller arrays.

In step 720, the tiles are merged to produce extended shapes on each of the layers, with each of the extended shapes comprising the elements from the layers on each of the tiles. Each layer may contain a number of discrete extended shapes comprising segments.

In step 725, the layers may be edited manually to introduce features into the N-well structure that are not addressed by the automatic process. These features may be associated with special requirements for connection and isolation. The editing of layers may also include providing a waiver for an edited feature that has produced, or may produce, a design rule violation.

The geometry of the shapes at boundaries may also be checked for acute angles that may be incompatible with the photolithographic processes used for fabrication. One or more instances of an extended shape may be removed from a layer, or have segments added or deleted.

For example, in an integrated circuit with a high degree of homogeneity (e.g., memory), one or more extended shapes may be removed entirely. In such cases, the opening size and pitch may be made larger in the deep N-well structure.

In step 730, design rule checks are made to insure the proper relationship between the deep N-well structure as represented on the layers, and the connected and unconnected N-wells, as well as the proper relationship to circuit components such as analog devices.

Perturbation of the shapes resident on the layers may be performed to detect connection ambiguities and circuit paths. For example, an opening may be expanded by altering the size and/or location of the extended shapes on the layers that form the opening perimeter. The alteration of one or more extended shapes on one or more layers is computationally more efficient than modifying a complex unified structure residing on a single layer.

In step 735, a check is made for design rule violations. If a design rule violation is found, step 725 is repeated to deal with the violation. If a design rule violation is not found, step 740 is performed.

In step 740, the layers are flattened to produce a single layer. Flattening produces the final pattern that will correspond to the deep N-well structure. At this point the bulk of the computationally intensive modifications to the deep N-well layout have been performed by working with tiles and layers. In the finished flat pattern, proximity correction or other global modifications may be made.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. For example, there are many combinations of the parameters for the implant and anneal process steps, and their sequencing, that may be used to produce the structures described herein. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method comprising:
   specifying a tile;
   creating a tile array using the specified tile;
   editing the tile array;
   merging the tile array to form a multi-layered structure including a plurality of openings and storing the multi-layered structure in a storage device;
   performing design rule checks on the multi-layered structure from the storage device;
   if a design rule violation occurs, editing the multi-layered structure; and
   in absence of the design rule violation, flattening the multi-layered structure from the storage device to form a deep N-well pattern by using a computational device.

2. The method of claim 1, wherein said editing the tile array comprises removing tiles that are not connected to surface N-wells.

3. The method of claim 1, wherein said editing the tile array comprises removing tiles to provide isolation for analog devices.

4. The method of claim 1, wherein said editing the tile array is performed to isolate surface N-wells from body-bias.

5. The method of claim 1, wherein said performing design rule checks comprises incrementally adjusting a size of at least one of the openings.

6. The method of claim 1, wherein said performing design rule checks comprises incrementally adjusting a position of at least one of the openings.

7. The method of claim 1, wherein said specifying comprises specifying a size of the tile.

8. The method of claim 1, wherein said specifying comprises specifying number of layers in the tile.

9. The method of claim 8, wherein said specifying further comprises specifying an element in each layer.

10. A method comprising:
    using tiles to form a multi-layered structure including a plurality of openings and storing the multi-layered structure in a storage device;
    in response to occurrence of a design rule violation, editing the multi-layered structure; and
    in absence of the design rule violation, flattening the multi-layered structure from the storage device to form a deep N-well pattern by using a computational device.

11. The method of claim 10, wherein said using tiles comprises removing tiles that are not connected to surface N-wells.

12. The method of claim 10, wherein said using tiles comprises removing tiles to provide isolation for analog devices.

13. The method of claim 10, wherein said using tiles comprises isolating surface N-wells from body-bias.

14. The method of claim 10, wherein said editing comprises incrementally adjusting a size of at least one of the openings.

15. The method of claim 10, wherein said editing comprises incrementally adjusting a position of at least one of the openings.

16. The method of claim 10, wherein said using tiles comprises specifying a size of the tiles.

17. The method of claim 10, wherein said using tiles comprises specifying number of layers in the tiles.

18. The method of claim 17, wherein said using tiles further comprises specifying an element in each layer.

19. A method comprising:
specifying a tile;
creating a tile array using the specified tile;
editing the tile array;
merging the tile array to form a multi-layered structure including a plurality of openings and storing the multi-layered structure in a storage device; and
in absence of a design rule violation, flattening the multi-layered structure from the storage device to form a deep N-well pattern by using a computational device.

20. The method of claim 19 further comprising:
if the design rule violation occurs, editing the multi-layered structure.

* * * * *

UNITED STATES PATENT AND TRADEMARK OFFICE
CERTIFICATE OF CORRECTION

PATENT NO.       : 8,146,037 B2
APPLICATION NO.  : 12/544149
DATED            : March 27, 2012
INVENTOR(S)      : Pelham et al.

Page 1 of 1

It is certified that error appears in the above-identified patent and that said Letters Patent is hereby corrected as shown below:

In Column 1, Line 54, delete "INVENTION" and insert -- THE INVENTION --, therefor.

In Column 2, Line 54, before "DESCRIPTION" insert -- DETAILED --.

In Column 5, Line 1, delete "that that" and insert -- that --, therefor.

In Column 6, Line 22, delete "Claims" and insert -- claims --, therefor.

In Column 8, Line 13, in Claim 20, delete "claim 19" and insert -- claim 19, --, therefor.

Signed and Sealed this
Eleventh Day of September, 2012

David J. Kappos
*Director of the United States Patent and Trademark Office*